United States Patent
Osada et al.

(10) Patent No.: US 7,348,051 B2
(45) Date of Patent: Mar. 25, 2008

(54) SURFACE-COATED CERMET CUTTING TOOL WITH HARD COATING LAYER HAVING EXCELLENT CHIPPING RESISTANCE

(75) Inventors: Akira Osada, Naka-gun (JP); Eiji Nakamura, Naka-gun (JP)

(73) Assignee: Mitsubishi Materials Corporation (JP)

( * ) Notice: Subject to any disclaimer, the term of this patent is extended or adjusted under 35 U.S.C. 154(b) by 293 days.

(21) Appl. No.: 11/174,015

(22) Filed: Jun. 30, 2005

(65) Prior Publication Data
US 2006/0003187 A1 Jan. 5, 2006

(30) Foreign Application Priority Data
Jun. 30, 2004 (JP) .............................. 2004-193158

(51) Int. Cl.
  *B23B 27/14* (2006.01)
(52) U.S. Cl. .......................... 428/216; 51/307; 51/309; 428/336; 428/698; 428/699
(58) Field of Classification Search ............... 51/307, 51/309; 428/216, 336, 698, 701
See application file for complete search history.

(56) References Cited

U.S. PATENT DOCUMENTS

| | | | |
|---|---|---|---|
| 5,786,069 A | | 7/1998 | Ljungberg et al. |
| 5,972,495 A | * | 10/1999 | Ishii et al. .................. 428/698 |
| 6,071,601 A | * | 6/2000 | Oshika et al. ............... 428/698 |
| 6,221,469 B1 | | 4/2001 | Ruppi |
| 6,251,508 B1 | | 6/2001 | Ruppi |
| 6,293,739 B1 | | 9/2001 | Uchino et al. |
| 6,436,519 B2 | * | 8/2002 | Holzschuh .................. 428/698 |

OTHER PUBLICATIONS

Patent Abstracts of Japan for JP06-31503 published Feb. 8, 1994.
Patent Abstracts of Japan for 10-015710 published on Jan. 20, 1998.
Patent Abstracts of Japan for 07-062542 (Patent No. 3278785) published on Mar. 7, 1995.
Patent Abstracts of Japan for 11-140647 published on May 25, 1999.
Patent Abstracts of Japan for 06-158325 (Patent No. 3109306) published on Jun. 7, 1994.
Patent Abstracts of Japan for 05-220604 (Patent No. 2982476) published on Aug. 31, 1993.
esp@cenet document view for EP1471165 published on Oct. 27, 2004.
European Search Report for EP 05 10 5419 completed Nov. 1, 2005.

* cited by examiner

*Primary Examiner*—Archene Turner
(74) *Attorney, Agent, or Firm*—Darby & Darby

(57) ABSTRACT

A surface-coated cermet cutting tool with a hard coating layer is provided. The surface-coated cermet cutting tool is formed by coating, on a surface of a tool substrate, the hard-coating layer which includes an upper layer and a lower layer. The lower layer contains titanium compound layers and the upper layer contains an $Al_2O_3$ layer. One layer of the titanium compound layers in the lower layer includes a TiCN layer which has an average layer thickness of 2.5 to 15 μm and indicates a tilt-angle frequency distribution graph in which the highest peak exists in a tilt angle section ranging 0 to 10° and the total sum of frequencies existing in the range of 0 to 10° occupies a ratio of 45% or more of the total frequencies in the tilt-angle frequency distribution graph.

10 Claims, 3 Drawing Sheets

[Fig. 1]
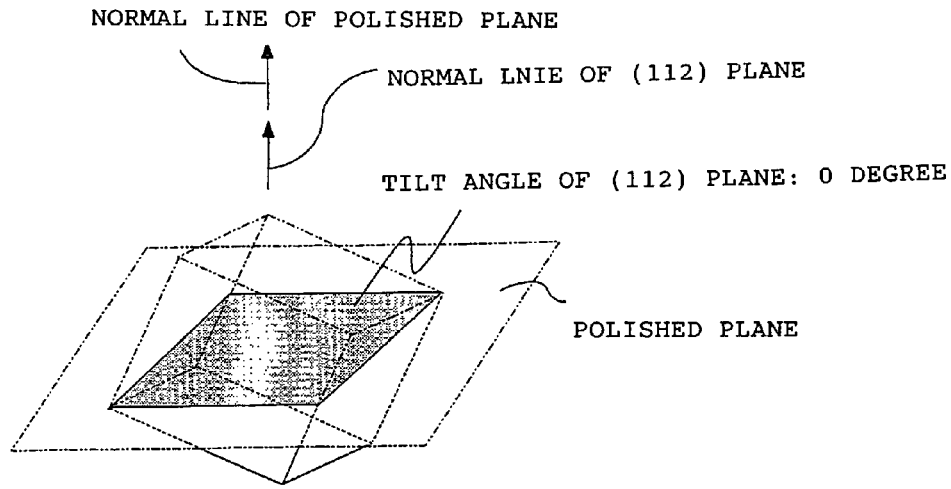
(a)
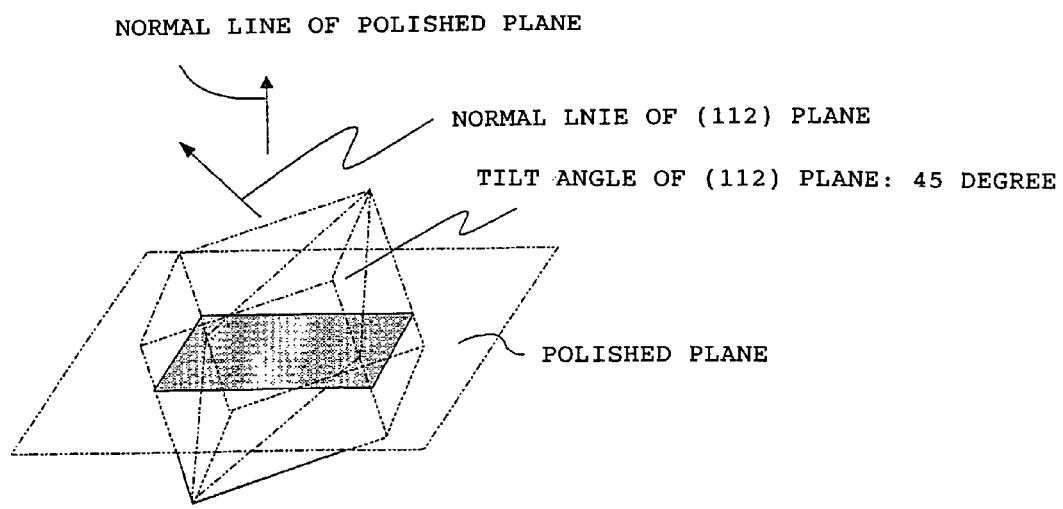
(b)

[Fig. 2]
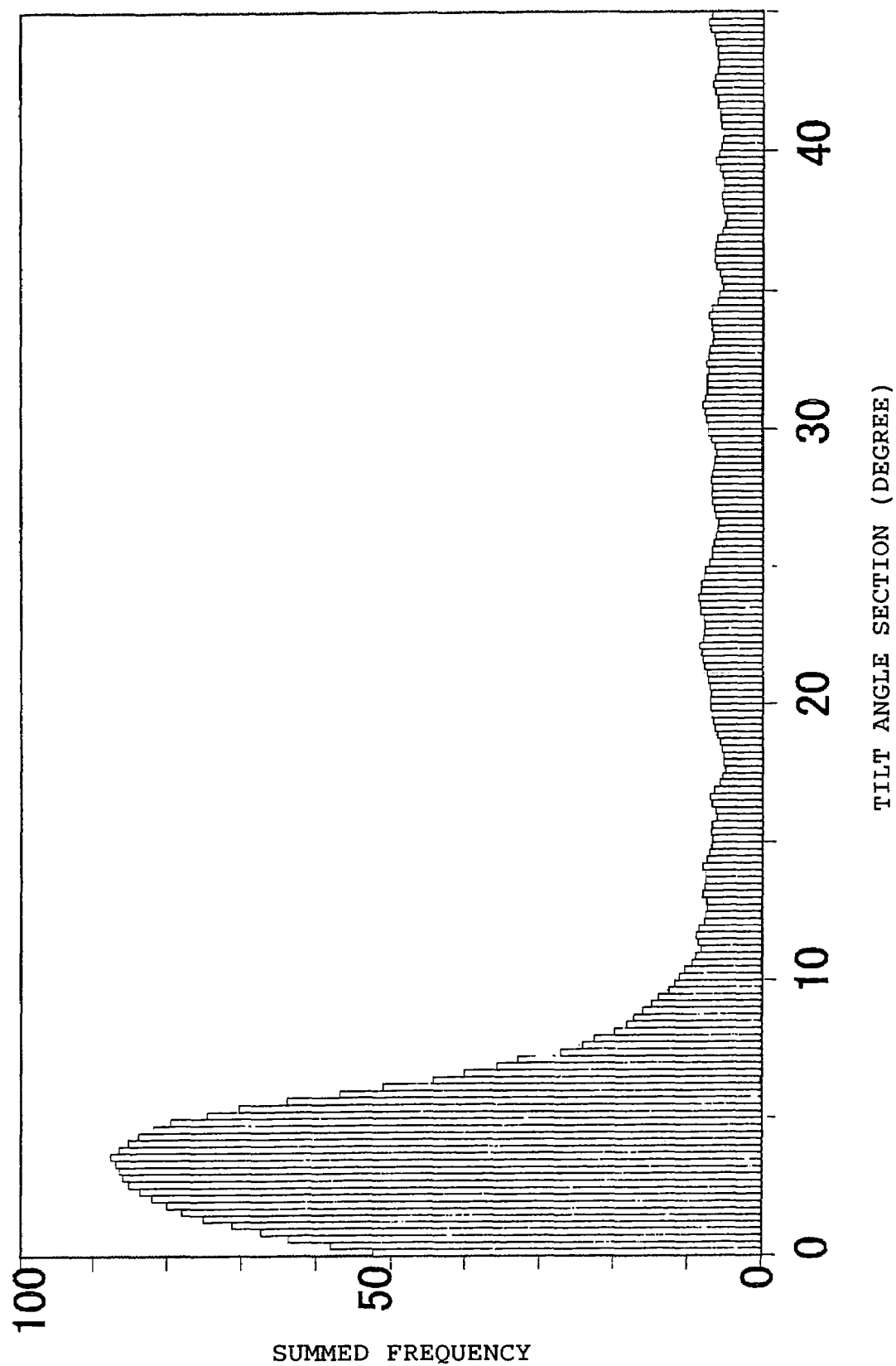

[Fig. 3]
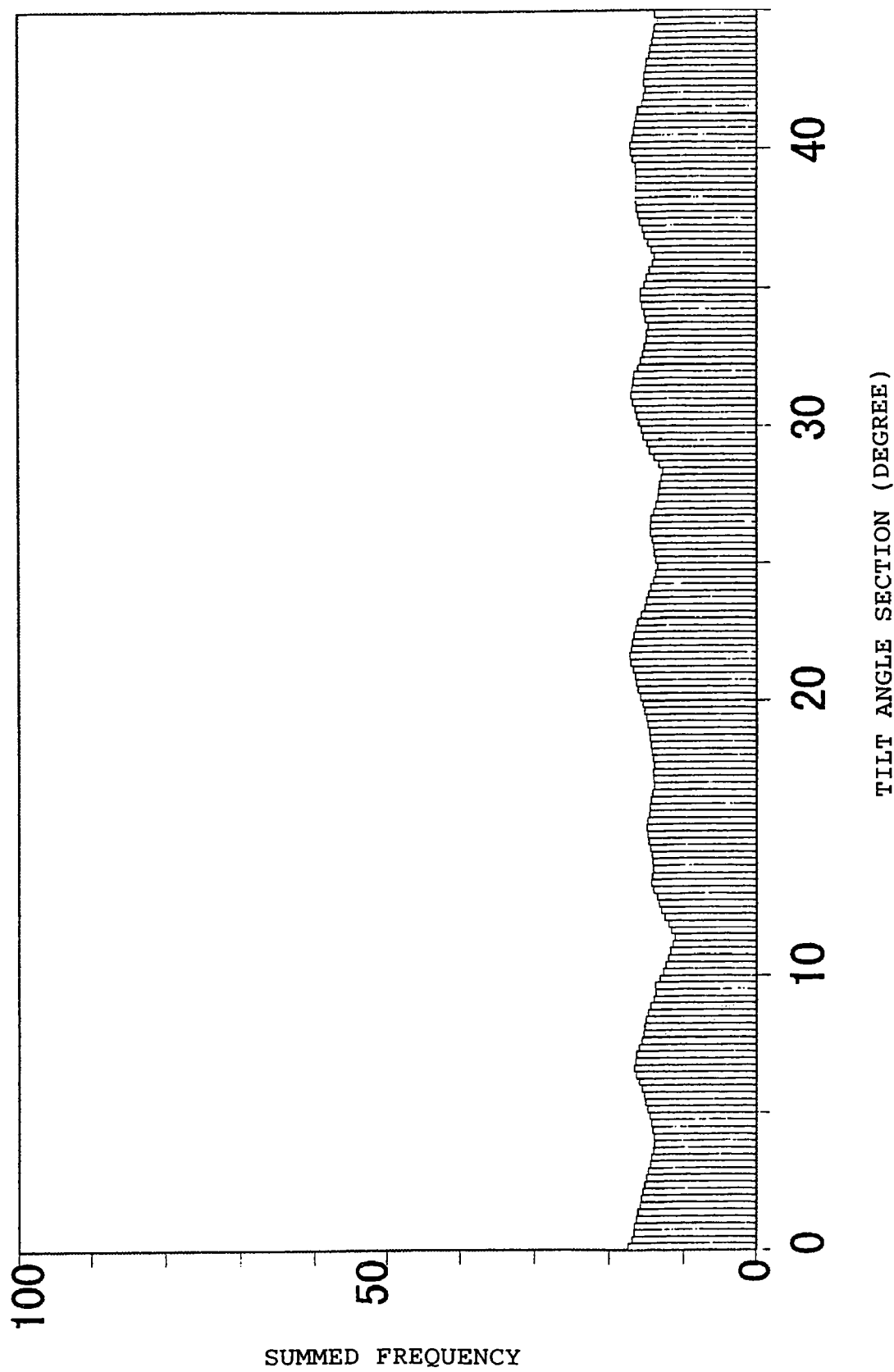

SURFACE-COATED CERMET CUTTING TOOL WITH HARD COATING LAYER HAVING EXCELLENT CHIPPING RESISTANCE

INCORPORATION BY REFERENCE

The present application claims priority under 35 U.S.C. §119 to Japanese Patent Application No. 2004-193158 filed on Jun. 30, 2004. The content of the application is incorporated herein by reference in its entirety.

BACKGROUND OF THE INVENTION

1. Field of the Invention

The present invention relates to a surface-coated cermet cutting tool (hereinafter, referred to as a coated cermet tool) of which a hard coating layer exhibits excellent chipping resistance during high-speed intermittent cutting of steel, cast iron, etc.

2. Description of the Related Art

In recent years, the performance of a cutting tool has been remarkably enhanced, and demands for labor saving and energy saving in cutting work and cost reduction have been increased. Accordingly, the cutting work is more often carried out at a higher speed range. The conventional coated cermet tools generally present no problem when they are used in the continuous cutting or intermittent cutting of steel, cast iron, or the like under normal conditions. Specifically, when the conventional cutting tools are used in a high-speed intermittent cutting under the severest cutting condition, i.e., in the high-speed intermittent cutting in which mechanical impacts are repeatedly applied to the cutting edge at very short pitches, the titanium compound layer which is the lower layer of the hard-coating layer has high-temperature strength and the $Al_2O_3$ layer which is the upper layer of the hard coating layer has high-temperature hardness and excellent heat resistance. However, since the high-temperature strength of the titanium compound layer is not sufficient, it is not possible to satisfactorily cope with the mechanical impacts. As a result, chipping (fine crack) easily occurs in the hard coating layer, consequently shortening the usable life of the coated cermet tools.

SUMMARY OF THE INVENTION

The present invention is contrived to solve the above problems and it is therefore an object of the present invention to provide a surface-coated cermet cutting tool with a hard coating layer having excellent chipping resistance.

Considering the above problems, the inventors have conducted studies for improving the chipping resistance of the hard coating layer of the coated cermet tools and have obtained the following results described below.

(a) On a surface of a tool substrate, the titanium compound layer as a lower layer of the hard coating layer of the coated cermet tools is formed using a conventional chemical vapor deposition reactor, under conditions:

Composition of reaction gas: in volume %, $TiCl_4$: 2 to 10%, $CH_3CN$: 0.5 to 3%, $N_2$: 10 to 30%, and $H_2$: balance, Temperature of reaction atmosphere: 820 to 920° C., and Pressure of reaction atmosphere: 6 to 20 kPa.

In addition, the content ratios of $CH_3CN$ constituting the reaction gas at the time point of starting the formation of the titanium compound layer and at the time point of finishing the formation of the titanium compound layer are specified within the content range described above in accordance with the layer thicknesses and the TiCN layer is formed under a condition that the content ratio of $CH_3CN$ is continuously or intermittently increased from the time point of starting the formation of the layer when the content ratio is relatively low to the time point of finishing the formation of the layer when the content ratio is relatively high. Then, the TiCN layer (hereinafter, referred to as "reformed TiCN layer") formed as a result has excellent high-temperature strength and excellent resistance to mechanical impacts. As a result, in the coated cermet tool including the $Al_2O_3$ layer which is the upper layer of the hard coating layer, the titanium compound layer which is the lower layer, and one layer of the titanium compound layer made of the reformed TiCN layer, the hard coating layer exhibits excellent chipping resistance even in the high-speed intermittent cutting with severe chemical impacts and the coated cermet tool thus has excellent wear resistance.

(b) The TiCN layer (hereinafter, referred to as "conventional TiCN layer") constituting the lower layer of the hard coating layer of the conventional coated cermet tool is deposited using a conventional chemical vapor deposition reactor, under conditions:

Composition of reaction gas: in volume %, $TiCl_4$: 1 to 5%, $CH_4$: 1 to 5%, $N_2$: 10 to 30%, and $H_2$: balance, Temperature of reaction atmosphere: 950 to 1050° C., and Pressure of reaction atmosphere: 6 to 20 kPa.

However, when the tilt-angle frequency distribution graph is prepared as shown in FIGS. 1(a) and 1(b), by utilizing a field-emission scanning electron microscope, irradiating electron beams to individual crystal particles with a cubic crystal lattice existing in a measurement range of a polished plane, measuring a tilt angle formed by the normal line of the polished plane and the normal line of {112} plane as a crystal plane of a crystal particle, sectioning the measured tilt angles belonging to a range of 0 to 45° every pitch of 0.25°, and collecting the frequencies existing in each section, the conventional TiCN layer exhibits a tilt-angle frequency distribution graph in which the distribution of the measured tilt angles of the {112} plane is unbiased in a range of 0 to 45° as shown in FIG. 4, while the reformed TiCN layer exhibits a tilt-angle frequency distribution graph in which the sharp highest peak occurs at a specific position in the tilt angle sections as shown in FIG. 3 and the sharp highest peak changes in position and height in the tilt angle sections of the horizontal axis in accordance with the content of $CH_3CN$ of the reaction gas.

(c) As described above, at the time of forming the TiCN layer, by setting the content of $CH_3CN$ in the reaction gas to 0.5 to 3%, specifying the contents of $CH_3CN$ at the time point of starting the film formation and at the time point of finishing the film formation to correspond to the layer thickness in the content range, and gradually increasing the content of $CH_3CN$ from the time point of starting the film formation to the time point of finishing the film formation, a tilt-angle frequency distribution graph is obtained in which the sharp highest peak occurs in the tilt angle sections ranging 0 to 10° and the sum of frequencies existing in the range of 0 to 10° occupies 45% or more of the total frequencies in the tilt-angle frequency distribution graph. In the tilt-angle frequency distribution graph, the ratio of the tilt angle frequencies in the range of 0 to 10° is 45% or more and the highest peak occurs in the tilt angle sections ranging 0 to 10°. In this case, according to the test results, it is preferable that the contents of $CH_3CN$ at the time point of starting the film formation and at the time point of finishing the film formation are set to the lower values in the range of 0.5 to 3% when the layer thickness is small, the contents of $CH_3CN$ at the time point of starting the film formation and at the time point of finishing the film formation are set to the middle values in the range when the layer thickness is middle, the contents of $CH_3CN$ are set to the higher values in the range when the layer thickness is great, and the content width, that is, (content of $CH_3CN$ at the time point of finishing the film formation)—(content of $CH_3CN$ at the time point of starting the film formation), is set 1±0.15%. When the content width is less than 0.85%, the ratio of the sum of frequencies existing in the range of 0 to 10° is less than 45% of the total frequencies in the tilt-angle frequency distribution graph and it is thus not possible to secure desired excellent high-temperature strength for the TiCN layer. On the contrary, when the content width is greater than 1.15%, the tilt angle sections having the highest peak departs from the range of 0 to 10° and thus it is not possible to secure desired excellent high-temperature strength for the TiCN layer similarly.

The research results shown in (a) to (c) described above have been obtained.

The present invention has been reached based on the above-mentioned research results. According to the present invention, there is provided a surface-coated cermet cutting tool with a hard coating layer having excellent chipping resistance in a high-speed intermittent cutting, the surface-coated cermet cutting tool being formed by coating, on a surface of a tool substrate made of WC-based cemented carbide or TiCN-based cermet, the hard-coating layer including the following upper and lower layers (a) and (b):

(a) as the lower layer, a titanium compound layer having at least two of a TiC layer, a TiN layer, a TiCN layer, a TiCO layer and a TiCNO layer, all of which are deposited by chemical vapor deposition, the titanium compound layer having a total average layer thickness of 3 to 20 μm, and (b) as the upper layer, an $Al_2O_3$ layer having an average layer thickness of 1 to 15 μm, which is deposited by chemical vapor deposition, wherein one layer of the titanium compound layer as the lower layer (a) comprises a reformed TiCN layer which has an average layer thickness of 2.5 to 15 μm and indicates a tilt-angle frequency distribution graph in which the highest peak exists in a tilt angle section ranging 0 to 10° and the total sum of frequencies existing in the range of 0 to 10° occupies a ratio of 45% or more of the total frequencies in the tilt-angle frequency distribution graph, the tilt-angle frequency distribution graph being obtained by utilizing a field-emission scanning electron microscope, irradiating electron beams to individual crystal particles with a cubic crystal lattice existing in a measurement range of a polished plane, measuring a tilt angle formed by the normal line of the polished plane and the normal line of {112} plane as a crystal plane of a crystal particle, sectioning the measured tilt angles belonging to a range of 0 to 45° every pitch of 0.25°, and collecting the frequencies existing in each section.

The reason for limiting the numerical values in the layers constituting the hard-coating layer of the coated cermet tool according to the present invention described above will be described below.

(a) Titanium Compound Layer (Lower Layer)

A titanium compound layer itself has high-temperature strength, and the hard-coating layer has high-temperature strength due to the existence of the titanium compound layer. In addition, the titanium compound layer is firmly adhered to both of the tool substrate and the $Al_2O_3$ layer as the upper layer. Accordingly, it contributes to the improvement of adherence of the hard-coating layer to the tool substrate. However, when the total average layer thickness is less than 3 μm, the above function cannot be sufficiently achieved. On the other hand, when the total average layer thickness is greater than 20 μm, thermal plastic deformation is apt to occur particularly in the high-speed intermittent cutting accompanying high heat generation, which causes partial wear. Accordingly, the average layer thickness is set to 3 to 20 μm.

(b) Reformed TiCN Layer

As described above, by setting the content ratio of $CH_3CN$ in the reaction gas to 0.5 to 3% and gradually increasing the content ratio of $CH_3CN$ from the time point of starting the film formation to the time point of finishing the film formation, the reformed TiCN layer exhibiting the tilt-angle frequency distribution graph in which the highest peak of the measured tilt angle occurs in the tilt angle sections ranging 0 to 10° and the sum ratio of frequencies existing in the tilt angle sections ranging 0 to 10° is 45 or more of the total frequencies is formed and thus the reformed TiCN layer has excellent high-temperature strength. However, when the average layer thickness thereof is less than 2.5 μm, the hard coating layer cannot have the desired excellent high-temperature strength and when the average layer thickness is greater than 15 μm, the thermal plastic deformation which causes partial wear can be easily generated and the wear is accelerated. As a result, the average layer thickness is set to 2.5 to 15 μm.

(c) $Al_2O_3$ Layer (Upper Layer)

The $Al_2O_3$ layer has excellent high-temperature hardness and heat resistance and contributes to improvement of the wear resistance of the hard coating layer. However, when the average layer thickness is less than 1 μm, the hard coating layer cannot have sufficient wear resistance. On the other hand, when the average layer thickness is greater than 15 μm, chipping is apt to occur. Accordingly, the average layer thickness thereof is set to 1 to 15 μm.

Furthermore, for the purpose of identification of the cutting tool before and after use thereof, a TiN layer having golden tone may be formed by deposition as needed. In this case, the average thickness of the TiN layer is preferably 0.1 to 1 μm. This is because, when the average layer thickness thereof is less than 0.1 μm, a sufficient identification effect cannot be achieved, whereas the identification effect due to the TiN layer is sufficient with an average layer thickness up to 1 μm.

The coated cermet tool according to the present invention exhibits excellent wear resistance, since the reformed TiCN layer which is one layer of the lower layer of the hard coating layer has excellent high-temperature strength and exhibits excellent chipping resistance even in the high-speed intermittent cutting of steel or cast iron having very high mechanical and thermal impacts.

BRIEF DESCRIPTION OF THE DRAWINGS

FIGS. 1(a) and 1(b) are schematic explanatory diagrams illustrating a measurement range of a tilt angle in the {112} plane of a crystal particle in a TiCN layer constituting a lower layer of a hard coating layer;

FIG. 2 is a tilt-angle frequency distribution graph of the {112} plane of a reformed TiCN layer constituting the lower layer of the hard coating layer of a coated cermet tool 10 according to the present invention;

FIG. 3 is a tilt-angle frequency distribution graph of the {112} plane of a conventional TiCN layer constituting a lower layer of a hard coating layer of a conventional coated cermet tool 10;

DETAILED DESCRIPTION OF THE PREFERRED EMBODIMENTS

Hereinafter, embodiments of a coated cermet tool according to the present invention will be described in detail.

The following powders, each having a mean particle size in a range of 1 to 3 μm, were prepared as raw materials for substrates: WC powder, TiC powder, ZrC powder, VC powder, TaC powder, NbC powder, $Cr_3C_2$ powder, TiN powder, TaN powder, and Co powder. Those raw powders were compounded with each other based on the compounding compositions shown in Table 1, were mixed with each other in an acetone solution having wax added thereto for 24 hours using a ball mill, and were dried under reduced pressure. Thereafter, the resultant powder mixture was press-formed into a green compact having a predetermined shape at a pressure of 98 MPa. The green compact was then sintered under the following conditions: a vacuum pressure of 5 Pa, a predetermined temperature in a range of 1370 to 1470° C., and a holding duration of 1 hour. After sintering, cutting edges were subjected to horning with a radius of 0.07 mm to manufacture tool substrates A to F made of WC-based cemented carbide and having insert shapes defined in ISO/CNMG120408.

Further, the following powders, each having a mean particle size in a range of 0.5 to 2 μm, were prepared as raw materials for substrates: TiCN (TiC/TiN=50/50 in weight ratio) powder, $Mo_2C$ power, ZrC power, NbC powder, TaC powder, WC power, Co powder and Ni powder. Those raw powders were compounded with each other based on the compounding composition shown in Table 2, were wet-mixed with each other for 24 hours using a ball mill, and were dried. Thereafter, the resultant powder mixture was pressed at a pressure of 98 MPa to form a green compact. The green compact was then sintered in a nitrogen atmosphere under the following conditions: a pressure of 1.3 kPa, a temperature of 1540° C., and a holding duration of 1 hour. After sintering, cutting edges were subjected to horning with a radius of 0.07 mm to manufacture tool substrates a to f made of TiCN-based cermet and having insert shapes defined in ISO Standard CNMG120412.

Next, on the surfaces of the tool substrates A to F and a to f, by using a general chemical vapour deposition reactor, titanium compound layers and reformed TiCN layers as lower layers of the hard coating layers were deposited with combinations and target layer thicknesses shown in Table 5 under conditions shown in Tables 3 and 4. Next, similarly, $Al_2O_3$ layers as upper layers were deposited with combinations and target layer thicknesses shown in Table 5 under conditions shown in Table 3. As a result, the coated cermet tools 1 to 13 according to the present invention were manufactured.

For the purpose of comparison, as shown in Table 6, titanium compound layers and $Al_2O_3$ layers as upper layers and lower layers of the hard coating layers were deposited with target layer thicknesses shown in Table 6 under the conditions shown in Table 3. As a result, conventional coated cermet tools 1 to 13 were manufactured.

Tilt-angle frequency distribution graphs were prepared for reformed TiCN layers and the conventional TiCN layers constituting the hard coating layers of the coated cermet tools according to the present invention and the conventional coated cermet tools by using a field-emission scanning electron microscope.

That is, in a state where the surfaces of the reformed TiCN layers and the conventional TiCN layers were set as polished planes, the coated cermet tools were set inside a lens barrel of the field-emission scanning electron microscope, electron beams with an acceleration voltage of 15 kV and an incidence angle of 70° about the polished plane were irradiated onto individual crystal particles with a cubic crystal lattice existing in a measurement range of the polished plane with an irradiation current of 1 nA, tilt angles formed by the normal line of the polished plane and the normal line of the {112} plane which is a crystal plane of the crystal particles were measured at intervals of 0.1 μm/step in an area of 30×50 μm by using an electron backscattering diffraction patterning apparatus, the measured tilt angles belonging to a range of 0 to 45° among the measured tilt angles were sectioned every pitch of 0.25°, and the frequencies belonging to each section were summed, whereby the tilt-angle frequency distribution graphs were prepared.

In the tilt-angle frequency distribution graphs of the reformed TiCN layers and the conventional TiCN layers obtained as the abovementioned preparation, the tilt angle section in which the {112} plane exhibits the highest peak and a ratio at which the tilt angle frequencies existing in the tilt angle sections ranging 0 to 10° occupied the total tilt angle frequencies in the tilt-angle frequency distribution graph were shown in Tables 5 and 6.

In the tilt-angle frequency distribution graphs, as shown in Tables 5 and 6, the reformed TiCN layers exhibited the tilt-angle frequency distribution graphs in which the distribution of measured tilt angles of the {112} plane exhibits the highest peak in the tilt angle sections ranging 0 to 10° and the ratio of the tilt angle frequencies existing in the tilt angle sections ranging 0 to 10° is 45% or more, while the conventional TiCN layers all exhibited the tilt-angle frequency distribution graphs in which the distribution of the measured tilt angles of the {112} plane are unbiased in the range of 0 to 45°, the highest peak does not exit, and the ratio of the tilt angle frequencies existing in the tilt angle sections ranging 0 to 10° is 30% or less.

FIG. 3 is a tilt-angle frequency distribution graph of the reformed TiCN layer of the coated cermet tool 10 according to the present invention and FIG. 4 is a tilt-angle frequency distribution graph of the conventional TiCN layer of the conventional coated cermet tool 10.

Furthermore, for the coated cermet tools 1 to 13 according to the present invention and the conventional coated cermet tools 1 to 13, the layers constituting the hard coating layers thereof were observed (the longitudinal sections of the layers were observed) by using an electron probe microanalyzer (EPMA) and an Auger spectroscopy analyzer. It was confirmed that the former and the latter include the titanium compound layers and the $Al_2O_3$ layers having substantially the same compositions as the target composition. Moreover, when the thicknesses of the layers constituting the hard coating layers of the coated cermet tools were measured using a scanning electron microscope (similarly, longitudinal sections of the layers were measured), all of the layers had substantially the same average layer thicknesses (average values of five point measurement) as the target layer thickness.

Next, in a state in which each of the above-mentioned coated cermet tools was screw-fixed to a insert holder made of tool steel with a fixing jig, the coated cermet tools 1 to 13 according to the present invention and the conventional coated cermet tools 1 to 13 were subjected to the following tests:

a dry high-speed intermittent cutting test of alloyed steel (normal cutting speed is 250 m/min) under the following condition (Cutting condition A):

Workpiece: a JIS/SCM 440 round bar having four longitudinal grooves equidistantly arranged in the longitudinal direction,
Cutting speed: 370 m/min,
Depth of cut: 1.0 mm,
Feed rate: 0.24 mm/rev,
Cutting time: 5 min;

a dry high-speed intermittent cutting test of carbon steel (normal cutting speed is 300 m/min) under the following condition (Cutting condition B):

Workpiece: a JIS/S30C round bar having four longitudinal grooves equidistantly arranged in the longitudinal direction,
Cutting speed: 400 m/min,
Depth of cut: 1.0 mm,
Feed rate: 0.20 mm/rev,
Cutting time: 5 min; and a dry high-speed intermittent cutting test of ductile cast iron (normal cutting speed is 250 m/min) under the following condition (Cutting condition C):

Workpiece: a JIS/FCD450 round bar having four longitudinal grooves equidistantly arranged in the longitudinal direction,
Cutting speed: 400 m/min,
Depth of cut: 1.2 mm,
Feed rate: 0.20 mm/rev,
Cutting time: 5 min, Then, the width of flank wear of a cutting edge was measured in each test. The measurement results are shown in Table 7.

TABLE 2

| Type | | Compounding Composition (mass %) | | | | | | | |
|------|---|----|----|-----|-----|-----|-------|-----|------|
|      |   | Co | Ni | ZrC | TaC | NbC | Mo₂C  | WC  | TiCN |
| Tool Substrate | a | 13 | 5 | — | 10 | — | 10 | 16 | Balance |
|  | b | 8 | 7 | — | 5 | — | 7.5 | — | Balance |
|  | c | 5 | — | — | — | — | 6 | 10 | Balance |
|  | d | 10 | 5 | — | 11 | 2 | — | — | Balance |
|  | e | 9 | 4 | 1 | 8 | — | 10 | 10 | Balance |
|  | f | 12 | 5.5 | — | 10 | — | 9.5 | 14.5 | Balance |

TABLE 3

| Layer Constituting Hard-coating layer Type | Formation Condition (Pressure of Reaction Atmosphere is expressed in kPa, and temperature thereof is expressed in ° C.) | | |
|---|---|---|---|
|  | Reaction Gas Composition (volume %) | Reaction Atmosphere | |
|  |  | Pressure | Temperature |
| TiC | TiCl₄: 4.2%, CH₄: 8.5%, H₂: Balance | 7 | 1020 |
| TiN (First Layer) | TiCl₄: 4.2%, N₂: 30%, H₂: Balance | 30 | 900 |
| TiN (Other Layers) | TiCl₄: 4.2%, N₂: 35%, H₂: Balance | 50 | 1040 |
| TiCN | TiCl₄: 4.2%, N₂: 20%, CH₄: 4%, H₂: Balance | 12 | 1020 |
| TiCO | TiCl₄: 4.2%, CO: 4%, H₂: Balance | 7 | 1020 |
| TiCNO | TiCl₄: 4.2%, CO: 3%, CH₄: 3%, N₂: 20%, H₂: Balance | 20 | 1020 |
| Al₂O₃ | AlCl₃: 2.2%, CO₂: 5.5%, HCl: 2.2%, H₂S: 0.2%, H₂: Balance | 7 | 1000 |

TABLE 1

| Type | | Compounding Composition (mass %) | | | | | | | | |
|------|---|-----|-----|-----|-----|-----|-------|-----|-----|----|
|      |   | Co  | TiC | ZrC | VC  | TaC | NbC | Cr₃C₂ | TiN | TaN | WC |
| Tool Substrate | A | 7 | — | 2 | — | — | 3 | — | 2 | — | Balance |
|  | B | 5.7 | — | — | — | 1.5 | 0.5 | — | — | — | Balance |
|  | C | 5.7 | — | — | — | — | — | 1 | — | — | Balance |
|  | D | 8.5 | — | 0.5 | — | — | — | 0.5 | — | — | Balance |
|  | E | 12.5 | 2 | — | — | — | — | — | 1 | 2 | Balance |
|  | F | 10 | — | — | 0.2 | — | — | 0.8 | — | — | Balance |

TABLE 4

Reformed TiCN Layer (Pressure is expressed in kPa and temperature is expressed in °C.)

| Target layer thickness (μm) | Formation Condition | | Reaction Atmosphere | | Film Formation Time (hr) |
|---|---|---|---|---|---|
| | | Reaction Gas Composition (volume %) | Pressure | Temperature | |
| 2.5 | Starting of film formation | TiCl$_4$: 5%, CH$_3$CN: 1.15%, N$_2$: 10%, H$_2$: Balance | 7 | 900 | 2 |
| | Finish of film formation | TiCl$_4$: 5%, CH$_3$CN: 2%, N$_2$: 10%, H$_2$: Balance | 7 | 900 | |
| 5 | Starting of film formation | TiCl$_4$: 3%, CH$_3$CN: 0.5%, N$_2$: 20%, H$_2$: Balance | 7 | 850 | 5 |
| | Finish of film formation | TiCl$_4$: 3%, CH$_3$CN: 1.5%, N$_2$: 20%, H$_2$: Balance | 7 | 850 | |
| 7.5 | Starting of film formation | TiCl$_4$: 8%, CH$_3$CN: 1.5%, N$_2$: 20%, H$_2$: Balance | 7 | 850 | 6 |
| | Finish of film formation | TiCl$_4$: 8%, CH$_3$CN: 2.5%, N$_2$: 20%, H$_2$: Balance | 7 | 850 | |
| 10 | Starting of film formation | TiCl$_4$: 2%, CH$_3$CN: 0.8%, N$_2$: 20%, H$_2$: Balance | 7 | 800 | 9 |
| | Finish of film formation | TiCl$_4$: 2%, CH$_3$CN: 1.7%, N$_2$: 20%, H$_2$: Balance | 7 | 800 | |
| 12.5 | Starting of film formation | TiCl$_4$: 5%, CH$_3$CN: 1%, N$_2$: 20%, H$_2$: Balance | 7 | 850 | 10 |
| | Finish of film formation | TiCl$_4$: 5%, CH$_3$CN: 2.0%, N$_2$: 20%, H$_2$: Balance | 7 | 850 | |
| 15 | Starting of film formation | TiCl$_4$: 7%, CH$_3$CN: 1.85%, N$_2$: 30%, H$_2$: Balance | 7 | 850 | 12 |
| | Finish of film formation | TiCl$_4$: 7%, CH$_3$CN: 3%, N$_2$: 30%, H$_2$: Balance | 7 | 850 | |

TABLE 5

Hard-coating layer (numerals in parentheses denotes target thickness: μm)

| Type | | Tool Substrate Symbol | Lower Layer (Ti Compound Layer) | | | | ※ Tilt angle section where {112} plane of TiCN has the highest peak (°) | Ratio of frequencies in tilt angle sections ranging 1 to 10° (%) | Upper Layer Target Thickness of Al$_2$O$_3$ Layer (μm) |
|---|---|---|---|---|---|---|---|---|---|
| | | | First Layer | Second Layer | Third Layer | Fourth Layer | | | |
| Coated Cermet Tool of the Present Invention | 1 | A | TiN (1) | ※TiCN (7.5) | TiN (1) | TiCNO (0.5) | 3.75-4.00 | 72 | 10 |
| | 2 | B | TiN (1) | ※TiCN (15) | TiC (3) | TiCNO (1) | 0.00-0.25 | 45 | 6 |
| | 3 | C | TiCN (1) | ※TiCN (5) | TiCO (0.5) | — | 6.25-6.50 | 55 | 15 |
| | 4 | D | TiC (1) | ※TiCN (10) | — | — | 2.50-2.75 | 51 | 5 |
| | 5 | E | TiN (1) | ※TiCN (5) | TiCO (0.5) | — | 6.75-7.00 | 56 | 5 |
| | 6 | F | TiN (0.5) | ※TiCN (2.5) | TiC (0.5) | TiCNO (0.5) | 9.50-9.75 | 60 | 3 |
| | 7 | A | TiN (1) | ※TiCN (12.5) | TiCNO (0.5) | — | 8.00-8.25 | 65 | 1 |
| | 8 | a | TiN (1) | ※TiCN (10) | TiCN (3) | — | 2.00-2.25 | 50 | 13 |

TABLE 5-continued

| | | Hard-coating layer (numerals in parentheses denotes target thickness: μm) | | | | | | |
|---|---|---|---|---|---|---|---|---|
| | | Lower Layer (Ti Compound Layer) | | | | | | |
| Type | Tool Substrate Symbol | First Layer | Second Layer | Third Layer | Fourth Layer | ✗ Tilt angle section where {112} plane of TiCN has the highest peak (°) | Ratio of frequencies in tilt angle sections ranging 1 to 10° (%) | Upper Layer Target Thickness of Al₂O₃ Layer (μm) |
| 9 | b | TiC (0.5) | ✗·TiCN (15) | TiCO (0.5) | — | 0.25-0.50 | 46 | 10 |
| 10 | c | TiN (1) | TiC (1) | ✗·TiCN (7.5) | TiCO (1) | 3.50-3.75 | 70 | 15 |
| 11 | c | TiN (1) | TiC (1) | ✗·TiCN (5) | — | 6.50-6.75 | 55 | 3 |
| 12 | d | TiC (0.1) | ✗·TiCN (2.5) | TiCNO (0.4) | — | 9.75-10.00 | 61 | 12 |
| 13 | f | TiCN (0.5) | ✗·TiCN (12.5) | TiCNO (0.5) | — | 8.50-8.75 | 66 | 1 |

(In Table 5, symbol "✗" denotes a reformed TiCN layer.)

TABLE 6

| | | Hard coating layer (numerals in parentheses denotes target thickness: μm) | | | | | | |
|---|---|---|---|---|---|---|---|---|
| | | Lower layer (Ti compound layer) | | | | | | |
| Type | | Tool Substrate Symbol | First Layer | Second Layer | Third Layer | Fourth Layer | Tilt angle section where {112} plane of TiCN has the highest peak (°) | Ratio of frequencies in tilt angle sections ranging 1 to 10° (%) | Upper layer Target Thickness of Al₂O₃ Layer (μm) |
| Conventional Coated Cermet Tool | 1 | A | TiN (1) | TiCN (7.5) | TiN (1) | TiCNO (0.5) | Not exist | 25 | 10 |
| | 2 | B | TiN (1) | TiCN (15) | TiC (3) | TiCNO (1) | Not exist | 21 | 6 |
| | 3 | C | TiCN (1) | TiCN (5) | TiCO (0.5) | — | Not exist | 17 | 15 |
| | 4 | D | TiC (1) | TiCN (10) | — | — | Not exist | 24 | 5 |
| | 5 | E | TiN (1) | TiCN (5) | TiCO (0.5) | — | Not exist | 28 | 5 |
| | 6 | F | TiN (0.5) | TiCN (2.5) | TiC (0.5) | TiCNO (0.5) | Not exist | 20 | 3 |
| | 7 | A | TiN (1) | TiCN (12.5) | TiCNO (0.5) | — | Not exist | 19 | 1 |
| | 8 | a | TiN (1) | TiCN (10) | — | — | Not exist | 24 | 13 |
| | 9 | b | TiC (0.5) | TiCN (15) | TiCO (0.5) | — | Not exist | 30 | 10 |
| | 10 | c | TiN (1) | TiC (1) | TiCN (7.5) | TiCO (1) | Not exist | 22 | 15 |
| | 11 | c | TiN (1) | TIC (1) | TiCN (5) | — | Not exist | 21 | 3 |
| | 12 | d | TiC (0.1) | TiCN (2.5) | TiCNO (0.4) | — | Not exist | 26 | 12 |
| | 13 | f | TiCN (0.5) | TiCN (12.5) | TiCNO (0.5) | — | Not exist | 23 | 1 |

TABLE 7

| | | Width of Flank Wear (mm) | | | | | Cutting Test Result | | |
|---|---|---|---|---|---|---|---|---|---|
| Type | | Cutting condition A | Cutting condition B | Cutting condition C | Type | | Cutting condition A | Cutting condition B | Cutting condition C |
| Coated Cermet | 1 | 0.17 | 0.16 | 0.20 | Conventional Coated | 1 | Usable life of 2.6 min. | Usable life of 2.5 min. | Usable life of 2.0 min. |

TABLE 7-continued

| Type | | Width of Flank Wear (mm) | | | Type | | Cutting Test Result | | |
|---|---|---|---|---|---|---|---|---|---|
| | | Cutting condition A | Cutting condition B | Cutting condition C | | | Cutting condition A | Cutting condition B | Cutting condition C |
| Tool of the Present Invention | 2 | 0.31 | 0.32 | 0.30 | Cermet Tool | 2 | Usable life of 0.2 min. | Usable life of 0.4 min. | Usable life of 0.9 min. |
| | 3 | 0.23 | 0.21 | 0.23 | | 3 | Usable life of 1.6 min. | Usable life of 1.9 min. | Usable life of 1.2 min. |
| | 4 | 0.28 | 0.25 | 0.26 | | 4 | Usable life of 1.2 min. | Usable life of 0.9 min. | Usable life of 1.0 min. |
| | 5 | 0.19 | 0.18 | 0.20 | | 5 | Usable life of 2.2 min. | Usable life of 2.3 min. | Usable life of 1.8 min. |
| | 6 | 0.29 | 0.29 | 0.29 | | 6 | Usable life of 0.7 min. | Usable life of 0.5 min. | Usable life of 0.8 min. |
| | 7 | 0.25 | 0.22 | 0.24 | | 7 | Usable life of 1.8 min. | Usable life of 1.5 min. | Usable life of 2.1 min. |
| | 8 | 0.28 | 0.27 | 0.31 | | 8 | Usable life of 1.1 min. | Usable life of 0.8 min. | Usable life of 0.7 min. |
| | 9 | 0.30 | 0.30 | 0.31 | | 9 | Usable life of 0.5 min. | Usable life of 0.9 min. | Usable life of 0.6 min. |
| | 10 | 0.18 | 0.18 | 0.19 | | 10 | Usable life of 2.4 min. | Usable life of 2.5 min. | Usable life of 2.8 min. |
| | 11 | 0.21 | 0.20 | 0.21 | | 11 | Usable life of 2.0 min. | Usable life of 2.1 min. | Usable life of 1.9 min. |
| | 12 | 0.30 | 0.27 | 0.28 | | 12 | Usable life of 0.8 min. | Usable life of 1.0 min. | Usable life of 0.8 min. |
| | 13 | 0.27 | 0.24 | 0.24 | | 13 | Usable life of 1.5 min. | Usable life of 1.2 min. | Usable life of 1.7 min. |

(In Table 7, variation in usable life is caused by chipping generated in the hard coating layer.)

As can be apparently seen from Tables 5 to 7, in the coated cermet tools 1 to 13 according to the present invention, since one layer in the lower layer of the hard coating layer comprises the reformed TiCN layer exhibiting the tilt-angle frequency distribution graph in which the tilt angle of the {112} plane exhibits the highest peak in the tilt angle sections ranging 0 to 10° and the ratio of the total frequencies existing in the tilt angle sections ranging 0 to 10° is 45% or more and the reformed TiCN layer has excellent high-temperature strength and excellent chipping resistance even in the high-speed intermittent cutting of steel or cast iron in which the mechanical impacts are very great, the generation of chipping in the cutting edge is suppressed remarkably and the excellent wear resistance is exhibited. On the contrary, in the conventional cermet tools 1 to 13 in which one layer of the lower layer of the hard coating layer comprises the conventional TiCN layer exhibiting the tilt-angle frequency distribution graph in which the distribution of the measured tilt angles of the {112} plane is unbiased in the range of 0 to 45° and the highest peak does not exist, since the mechanical impact resistance of the hard coating layer is not sufficient in the high-speed intermittent cutting, chipping occurs in the cutting edge, thereby shortening the usable life thereof.

As described above, the coated cermet tools according to the present invention have the hard coating layer exhibiting excellent chipping resistance not only in the continuous cutting or intermittent cutting of various materials such as steel and cast iron under normal conditions but also in the high-speed intermittent cutting under the severest cutting conditions accompanying very high-temperature strength and exhibit excellent cutting performance for a prolonged period of time. Accordingly, it is possible to sufficiently and satisfactorily cope with the demand for high performance of a cutting device, labor saving and energy saving in a cutting work, and cost reduction.

What is claimed is:

1. A surface-coated cermet cutting tool, comprising:
a hard coating layer coated on a surface of a tool substrate made of tungsten-carbide-based cemented carbide or titanium-carbonitride-based cermet,
the hard-coating layer including a lower layer and an upper layer:
the lower layer containing titanium compound layers having at least two of a titanium carbide layer, a titanium nitride layer, a titanium carbonitride layer, a titanium carbooxide layer and a titanium oxycarbonitride layer, the titanium compound layers having a total average layer thickness of 3 to 20 µm; and
the upper layer containing an aluminum oxide layer having an average layer thickness of 1 to 15 µm,
wherein one layer of the titanium compound layers in the lower layer comprises a titanium carbonitride layer which has an average layer thickness of 2.5 to 15 µm, and the one layer has properties indicated by a tilt-angle frequency distribution graph in which the highest peak exists in a tilt angle section ranging 0 to 10° and the total sum of frequencies existing in the range of 0 to 10° occupies a ratio of 45% or more of the total frequencies in the tilt-angle frequency distribution graph, the tilt-angle frequency distribution graph being obtained by utilizing a field-emission scanning electron microscope, irradiating electron beams to individual crystal particles with a cubic crystal lattice existing in a measurement range of a polished plane, measuring a tilt angle formed by the normal line of the polished plane and the normal line of {112} plane as a crystal plane of the crystal particles, sectioning the measured tilt angles belonging to a range of 0 to 45° every pitch of 0.25°, and collecting the frequencies existing in each section.

2. A surface-coated cermet cutting tool, comprising:
a tool substrate; and
a hard coating layer coated on the tool substrate, the hard-coating layer including a lower layer and an upper layer, the lower layer containing titanium compound layers, and the upper layer containing an aluminum oxide layer, wherein one layer of the titanium compound layers in the lower layer comprises a titanium carbonitride layer which has an average layer thickness of 2.5 to 15 μm, and the one layer has properties indicated by a tilt-angle frequency distribution graph in which the highest peak exists in a tilt angle section ranging 0 to 10° and the total sum of frequencies existing in the range of 0 to 10° occupies a ratio of 45% or more of the total frequencies in the tilt-angle frequency distribution graph, the tilt-angle frequency distribution graph being obtained by utilizing a field-emission scanning electron microscope, irradiating electron beams to individual crystal particles with a cubic crystal lattice existing in a measurement range of a polished plane, measuring a tilt angle formed by the normal line of the polished plane and the normal line of {112} plane as a crystal plane of the crystal particles, sectioning the measured tilt angles belonging to a range of 0 to 45° every pitch of 0.25°, and collecting the frequencies existing in each section.

3. The surface-coated cermet cutting tool according to claim 2, wherein the titanium compound layers comprise at least two of the following:

a titanium carbide layer, a titanium nitride layer, a titanium carbonitride layer, a titanium carbooxide layer and a titanium oxycarbonitride layer.

4. The surface-coated cermet cutting tool according to claim 2, wherein the titanium compound layers having a total average layer thickness of 3 to 20 μm.

5. The surface-coated cermet cutting tool according to claim 2, wherein the aluminum oxide layer having an average layer thickness of 1 to 15 μm.

6. A surface-coated cermet cutting tool, comprising:

a tool substrate; and a hard coating layer coated on the tool substrate, the hard-coating layer including a lower layer and an upper layer, the lower layer containing titanium compound layers, and the upper layer containing an aluminum oxide layer, wherein one layer of the titanium compound layers in the lower layer comprises a titanium carbonitride layer which has an average layer thickness of 2.5 to 15 μm, and the one layer has properties indicated by a tilt-angle frequency distribution graph in which the highest peak exists in a tilt angle section ranging 0 to 10° and the total sum of frequencies existing in the range of 0 to 10° occupies a ratio of 45% or more of the total frequencies in the tilt-angle frequency distribution graph, and wherein the tilt angle is formed by the normal line of a polished plane and the normal line of {112} plane as a crystal plane of crystal particles of the one layer.

7. The surface-coated cermet cutting tool according to claim 6, wherein the tilt-angle frequency distribution graph is obtained by utilizing a field-emission scanning electron microscope, irradiating electron beams to individual crystal particles with a cubic crystal lattice existing in a measurement range of the polished plane, measuring the tilt angle formed by the normal line of the polished plane and the normal line of {112} plane as the crystal plane of the crystal particles, sectioning the measured tilt angles belonging to a range of 0 to 45° every pitch of 0.25°, and collecting the frequencies existing in each section.

8. The surface-coated cermet cutting tool according to claim 6, wherein the titanium compound layers comprise at least two of the following:

a titanium carbide layer, a titanium nitride layer, a titanium carbonitride layer, a titanium carbooxide layer and a titanium oxycarbonitride layer.

9. The surface-coated cermet cutting tool according to claim 6, wherein the titanium compound layers having a total average layer thickness of 3 to 20 μm.

10. The surface-coated cermet cutting tool according to claim 6, wherein the aluminum oxide layer having an average layer thickness of 1 to 15 μm.

* * * * *

UNITED STATES PATENT AND TRADEMARK OFFICE
CERTIFICATE OF CORRECTION

PATENT NO.      : 7,348,051 B2                                            Page 1 of 1
APPLICATION NO. : 11/174015
DATED           : March 25, 2008
INVENTOR(S)     : Akira Osada et al.

It is certified that error appears in the above-identified patent and that said Letters Patent is hereby corrected as shown below:

In the title Page (73):

Please delete "(JP)" and insert --Tokyo (JP)--

Signed and Sealed this

Twentieth Day of January, 2009

JON W. DUDAS
*Director of the United States Patent and Trademark Office*